US008466721B2

(12) United States Patent
Shima et al.

(10) Patent No.: US 8,466,721 B2
(45) Date of Patent: Jun. 18, 2013

(54) INJECTION LOCKED FREQUENCY DIVIDER AND PLL CIRCUIT

(75) Inventors: Takahiro Shima, Kanagawa (JP); Junji Sato, Tokyo (JP); Masashi Kobayashi, Tokyo (JP)

(73) Assignee: Panasonic Corporation, Osaka (JP)

(*) Notice: Subject to any disclaimer, the term of this patent is extended or adjusted under 35 U.S.C. 154(b) by 28 days.

(21) Appl. No.: 13/266,160

(22) PCT Filed: Jan. 21, 2011

(86) PCT No.: PCT/JP2011/000317
§ 371 (c)(1),
(2), (4) Date: Oct. 25, 2011

(87) PCT Pub. No.: WO2011/089918
PCT Pub. Date: Jul. 28, 2011

(65) Prior Publication Data
US 2012/0038396 A1    Feb. 16, 2012

(30) Foreign Application Priority Data

Jan. 22, 2010  (JP) ................................. 2010-012131

(51) Int. Cl.
*H03B 19/06*   (2006.01)

(52) U.S. Cl.
USPC ............................ 327/118; 327/115; 327/117

(58) Field of Classification Search
USPC ................ 327/115, 116, 117, 118, 355–361, 327/202, 203, 208–212, 218; 377/47, 48
See application file for complete search history.

(56) References Cited

U.S. PATENT DOCUMENTS

| | | | |
|---|---|---|---|
| 7,741,923 B2* | 6/2010 | Deng et al. | 331/167 |
| 8,067,987 B2* | 11/2011 | Sen et al. | 331/2 |
| 2005/0248410 A1* | 11/2005 | Su | 331/16 |
| 2006/0244499 A1* | 11/2006 | Miyata et al. | 327/156 |
| 2007/0120588 A1* | 5/2007 | Lim et al. | 327/291 |
| 2008/0246511 A1* | 10/2008 | Miura et al. | 326/83 |
| 2011/0001521 A1* | 1/2011 | Lorenzon et al. | 327/115 |

FOREIGN PATENT DOCUMENTS

| | | |
|---|---|---|
| JP | 5-48402 | 2/1993 |
| JP | 9-246957 | 9/1997 |
| JP | 10-93399 | 4/1998 |

OTHER PUBLICATIONS

International Search Report dated Feb. 15, 2011.
M. Motoyoshi, et al., "58.8/39.2GHz Dual-Modulus CMOS Frequency Divider," School of Engineering, School of Frontier Sciences, The University of Tokyo, 2007, pp. 100, with English translation.

* cited by examiner

*Primary Examiner* — Lincoln Donovan
*Assistant Examiner* — Brandon S Cole
(74) *Attorney, Agent, or Firm* — Dickinson Wright PLLC

(57) ABSTRACT

An injection locked frequency divider and a PLL circuit, having a wide operating frequency bandwidth and capable of reducing the influence of any parasitic capacitance, are provided. Injection locked frequency divider (100) includes ring oscillator 140 that cascade-connects first amplifier circuit (141) including N-channel MOS transistor (111) and P-channel MOS transistor (112), and second amplifier circuit 142 and third amplifier circuit (143) that have the same configuration as first amplifier circuit (141) in three stages in a ring; N-channel MOS transistor 150 in which the sources of N-channel MOS transistors (111, 121, 131) in the respective stages are connected to the drain thereof; and differential signal injection circuit (160) that injects injection signal I1 to the gates of P-channel MOS transistors (112, 122, 132) in the respective stages and injects a reverse phase signal of injection signal I1 as a differential signal to the gate of N-channel MOS transistor (150).

4 Claims, 15 Drawing Sheets

|  | FIRST STAGE | SECOND STAGE | THIRD STAGE |
| --- | --- | --- | --- |
| PHASE OF fo | 0° | ±120° | ±240° |
| PHASE OF 2fo | 0° | ±240° | ±120° |
| PHASE OF 3fo (INJECTION SIGNAL) | 0° | 0° | 0° |

FIG.3

| | FIRST STAGE | | SECOND STAGE | |
|---|---|---|---|---|
| | Q11 | Q12 | Q13 | Q14 |
| PHASE OF fo | 0° | ±180° | ±90° | ±270° |
| PHASE OF 2fo (INJECTION SIGNAL) | 0° | 0° | ±180° | ±180° |

INJECTION LOCKED FREQUENCY DIVIDER AND PLL CIRCUIT

TECHNICAL FIELD

The present invention relates to an injection locked frequency divider and a PLL (Phase Locked Loop) circuit for use in a portable communication terminal device. More specifically, the present invention relates to an injection locked frequency divider and a PLL circuit, having a wide frequency bandwidth and capable of frequency-dividing a frequency signal of at least 10 GHz.

BACKGROUND ART

In recent years, portable communication terminal devices that have been widespread explosively have been required to be faster, and PLL circuits operated in a wide frequency bandwidth have been essential as the frequency synthesizer of a radio section. In the PLL circuits, a circuit that frequency-divides a high frequency signal to a low frequency is a frequency divider, and in particular, an injection locked frequency divider in a frequency bandwidth of at least 10 GHz has been known (for instance, see Non-Patent Literature 1).

FIG. 1 is a circuit diagram showing the configuration of injection locked frequency divider 10 described in Non-Patent Literature 1.

As shown in FIG. 1, injection locked frequency divider 10 includes ring oscillator 40 that cascade-connects first amplifier circuit 41, second amplifier circuit 42, and third amplifier circuit 43 in three stages in a ring (also called a loop) and signal injection circuit 50 that outputs injection signal I1.

First amplifier circuit 41 includes N-channel MOS (Metal Oxide Semiconductor) transistor 11 and P-channel MOS transistor 12. The gate of N-channel MOS (Metal Oxide Semiconductor) transistor 11 receives the feedback output of third amplifier circuit 43. P-channel MOS transistor 12 functions as a load.

Second amplifier circuit 42 includes N-channel MOS transistor 21 and P-channel MOS transistor 22. The gate of N-channel MOS transistor 21 receives the output of first amplifier circuit 41. P-channel MOS transistor 22 functions as a load.

Third amplifier circuit 43 includes N-channel MOS transistor 31 and P-channel MOS transistor 32. The output of second amplifier circuit 42 is inputted to the gate of N-channel MOS transistor 31. P-channel MOS transistor 32 functions as a load.

Signal injection circuit 50 is connected to the gates of P-channel MOS transistors 12, 22, and 32 in all stages.

The sources of P-channel MOS transistors 12, 22, and 32 are connected to high potential power source Vdd, and the sources of N-channel MOS transistors 11, 21, and 31 are grounded.

The operation of injection locked frequency divider 10 will be described.

FIG. 2 is a diagram showing the frequencies of the output signal of injection locked frequency divider 10, and FIG. 3 is a diagram showing the phases in the respective stages of ring oscillator 40.

As shown in FIG. 2, when the injection signal from signal injection circuit 50 is not inputted, oscillation signal F1 of free-running frequency f0, second-order harmonic component F2 of frequency $2fo$, and third-order harmonic component F3 of frequency $3fo$ occur in the output of ring oscillator 40.

Next, when injection signal I1 from signal injection circuit 50 is the signal near frequency $3fo$, injection signal T1 and second-order harmonic component F2 are mixed so that output signal I2 provided by down-converting the injection signal occurs near free-running frequency fo. Oscillation signal F1 of ring oscillator 40 is drawn to and synchronized with the frequency of output signal I2.

The phases of oscillation signal F1 in the respective stages of ring oscillator 40 at this time have a phase rotation of 120°, as shown in FIG. 3. Therefore, when the first stage has a phase rotation of 0', the second stage has a phase rotation of ±120° and the third stage has a phase rotation of ±240°. In addition, since the phases of third-order harmonic component F3 in the respective stages become three times those of oscillation signal F1, all the stages have a phase rotation of 0° and are in phase. That is, it suffices that the phases of injection signal I1 in the respective stages are all in phase.

In this way, since the input of injection signal I1 near frequency $3fo$ provides output signal I2 near free-running frequency fo, injection locked frequency divider 10 is operated as a frequency divider for ⅓ frequency division.

FIG. 4 is a diagram showing the frequency characteristic of the voltage amplitude of injection signal I1. Injection signal I1 is the signal inputted from signal injection circuit 50 necessary for stable synchronization of injection locked frequency divider 10.

As shown in FIG. 4, it suffices that the voltage amplitude of the injection signal is minimum near the frequency three times free-running frequency fo of ring oscillator 40, and injection locked frequency divider 10 can be operated in a frequency bandwidth of about 5 GHz at a voltage amplitude of 200 mVpp.

CITATION LIST

Non-Patent Literature

NPL 1
"58. 8/39. 2 GHz Dual-Modulus CMOS Frequency Divider, General Conference of The Institute of Electronics, Information and Communication Engineers, 2007"

Patent Literature

PTL 1
Japanese Patent Application Laid-Open No. 10-93399

SUMMARY OF INVENTION

Technical Problem

However, such conventional injection locked frequency divider has the following problems.

FIG. 5 is a circuit block diagram including parasitic capacitance components in injection locked frequency divider 10.

As shown in FIG. 5, in an actual wiring layout, parasitic capacitances C1, C2, and C3 occur between the wires and the substrate. Due to the occurrence of parasitic capacitances C1, C2, and C3, the signal amplitude in the respective stages becomes smaller. Since injection signal I1 is attenuated, output signal I2 down-converted also becomes smaller, with the result that synchronization becomes difficult. Consequently, the operating frequency bandwidth becomes narrower.

It is therefore an object of the present invention to provide an injection locked frequency divider and a PLL circuit, having a wide operating frequency bandwidth and capable of reducing the influence of any parasitic capacitance.

Solution to Problem

An injection locked frequency divider of the present invention includes a ring oscillator that cascade-connects amplifier circuits each including an N-channel MOS transistor and a P-channel MOS transistor in (2n+1) (n is any natural number) stages in a ring; an electric current source that is connected to the ring oscillator and includes an N-channel MOS transistor that drives the ring oscillator; and a differential signal injection circuit that outputs an injection signal to the ring oscillator and outputs a reverse phase signal of the injection signal as a differential signal to the electric current source, wherein the drain of the N-channel MOS transistor of the electric current source is connected to the source of the N-channel MOS transistor of the ring oscillator, wherein the differential signal injection circuit outputs the injection signal to the gate of the P-channel MOS transistor of the ring oscillator and outputs the differential signal to the gate of the N-channel MOS transistor of the electric current source.

A PLL circuit of the present invention that performs a frequency negative feedback operation includes a reference signal oscillator that outputs a reference signal; a voltage controlled oscillator that outputs a high frequency signal; an injection locked frequency divider that frequency-divides the high frequency signal; a phase frequency detector that compares the frequency division signal of the injection locked frequency divider with the output signal of the reference signal oscillator and outputs a phase-frequency error; a charge pump that converts the phase-frequency error detected by the phase frequency detector to an electric current; and a loop filter that generates the control voltage of the voltage controlled oscillator and outputs the generated control voltage to the voltage controlled oscillator, wherein the control voltage controls the voltage controlled oscillator so that the error detected by the phase frequency detector can become smaller, the PLL circuit, wherein the injection locked frequency divider uses the injection locked frequency divider.

Advantageous Effects of Invention

According to the present invention, it is possible to realize an injection locked frequency divider and a PLL circuit, having a wide operating frequency bandwidth. In addition, it is possible to realize a very simplified circuit configuration that can be easily embodied with a fewer number of components.

BRIEF DESCRIPTION OF DRAWINGS

FIG. 3 is a diagram showing the phases in the respective stages of a ring oscillator of conventional injection locked frequency divider 1;

DESCRIPTION OF EMBODIMENTS

Hereinafter, embodiments of the present invention will be described in detail with reference to the accompanying drawings.

Embodiment 1

Figure 6:
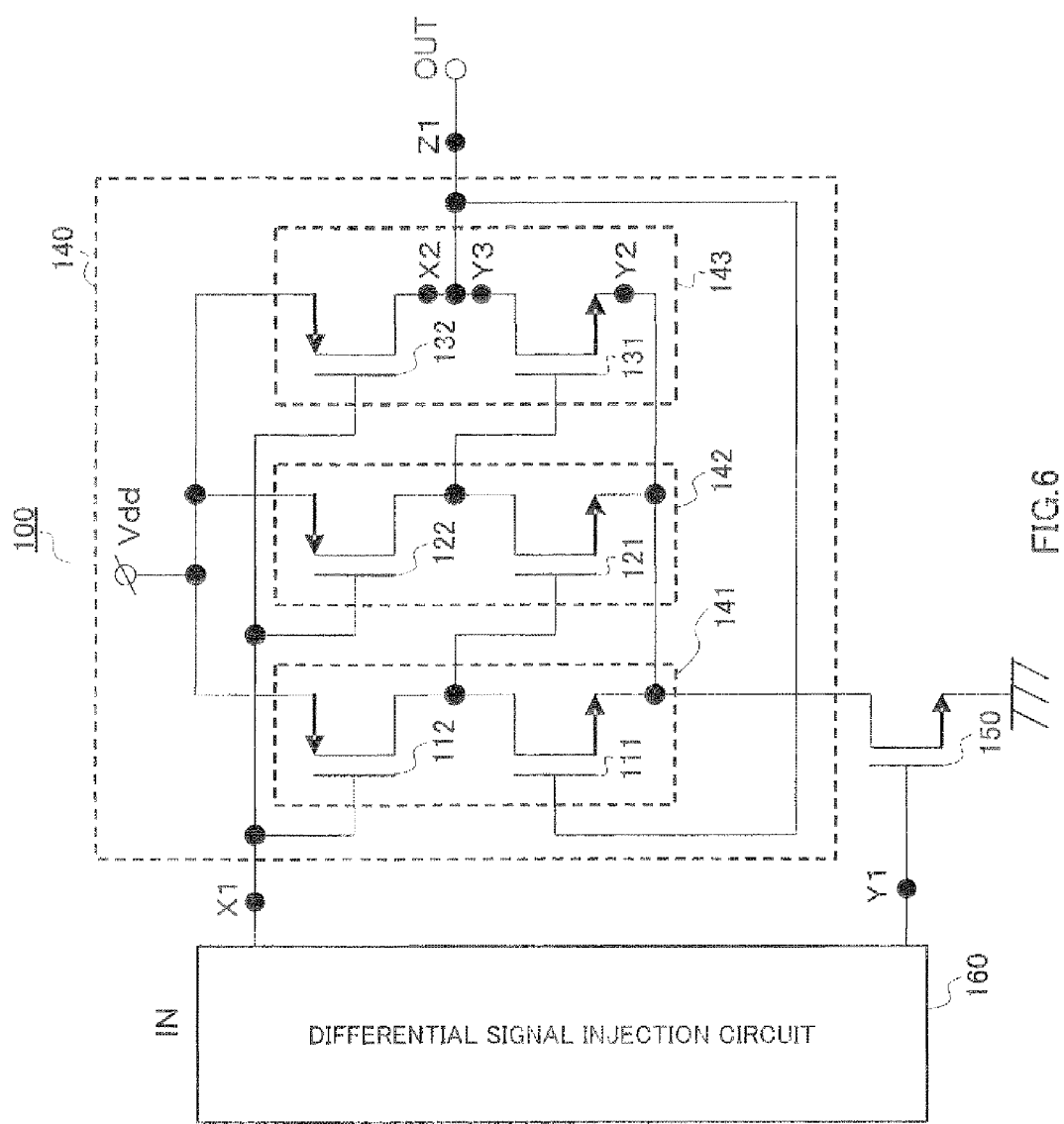
FIG. 6 is a circuit diagram showing configuration of an injection locked frequency divider according to Embodiment 1 of the present invention.

FIG. 6 is a circuit diagram showing the configuration of an injection locked frequency divider according to Embodiment 1 of the present invention. This embodiment is applicable to an injection locked frequency divider mounted on a PLL circuit.

As shown in FIG. 6, injection locked frequency divider 100 includes ring oscillator 140 that cascade-connects first amplifier circuit 141, second amplifier circuit 142, and third amplifier circuit 143 in three stages in a ring, N-channel MOS transistor 150, and differential signal injection circuit 160.

First amplifier circuit 141 includes N-channel MOS transistor 111 and P-channel MOS transistor 112. The feedback output of third amplifier circuit 143 is inputted to the gate of N-channel MOS transistor 111. P-channel MOS transistor 112 functions as a load.

Second amplifier circuit 142 includes N-channel MOS transistor 121 and P-channel MOS transistor 122. The output of first amplifier circuit 141 is inputted to the gate of N-channel MOS transistor 121. P-channel MOS transistor 122 functions as a load.

Third amplifier circuit 143 includes N-channel MOS transistor 131 and P-channel MOS transistor 132. The output of second amplifier circuit 142 is inputted to the gate of N-channel MOS transistor 131. P-channel MOS transistor 132 functions as a load.

The drain of N-channel MOS transistor 150 is connected to the sources of N-channel MOS transistors 111, 121, and 131.

Differential signal injection circuit 160 outputs injection signal X1 to the gates of P-channel MOS transistors 112, 122, and 132 in the respective stages. Differential signal injection circuit 160 outputs reverse phase signal Y1 of injection signal X1 as a differential signal to the gate of N-channel MOS transistor 150.

The sources of P-channel MOS transistors 112, 122, and 132 are connected to high potential power source Vdd. The source of N-channel MOS transistor 150 is grounded.

The drain of N-channel MOS transistor 131 and the drain of P-channel MOS transistor 132 of third amplifier circuit 143 are connected to become the output of ring oscillator 140.

Figure 1:
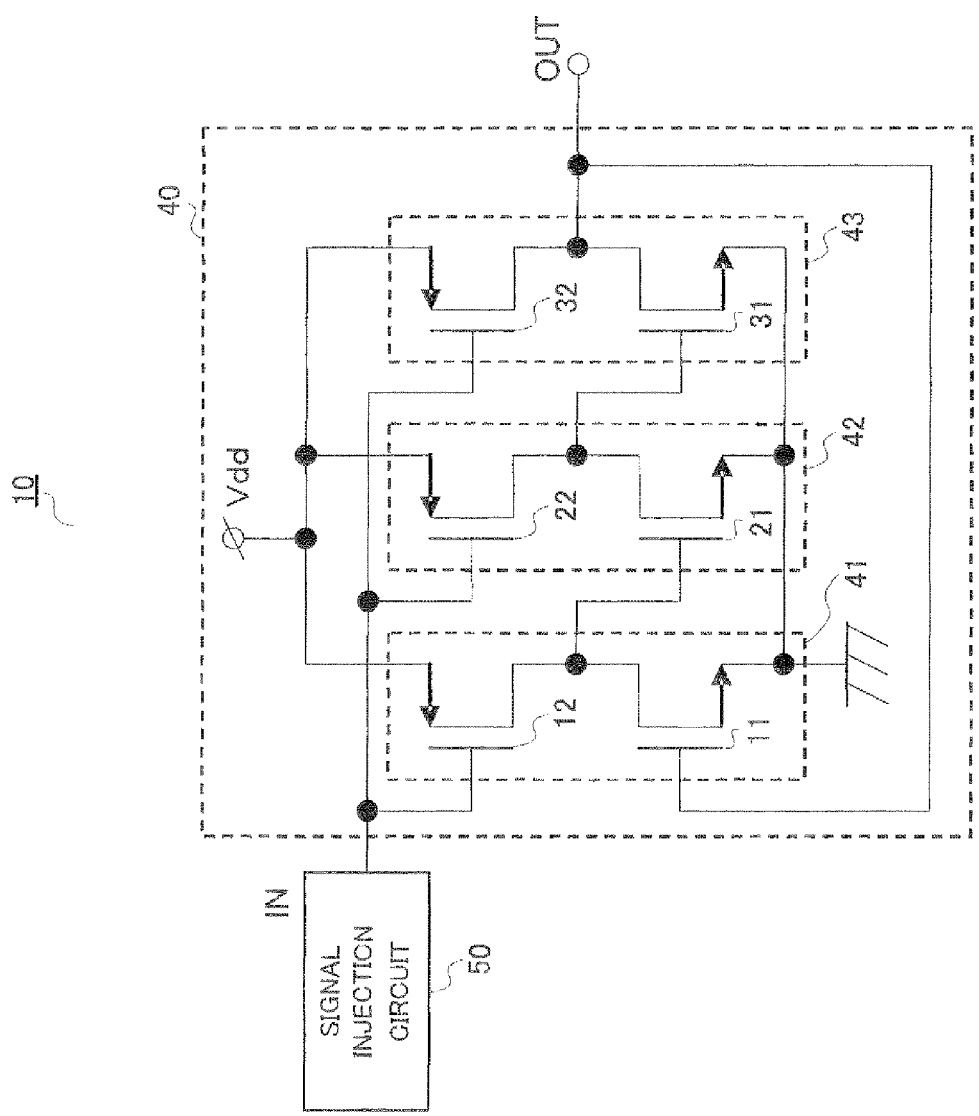
FIG. 1 a circuit diagram showing configuration of conventional injection locked frequency divider 1.

In this way, injection locked frequency divider 100 of this embodiment solves the problem of injection locked frequency divider 10 (FIG. 1) of Non-Patent Literature 1 that the operating frequency bandwidth becomes narrower.

Accordingly, as shown in FIG. 6, injection locked frequency divider 100 of this embodiment inputs the signal to the sources of N-channel MOS transistors 111, 121, and 131 of the amplifier circuits in the respective stages of ring oscillator 140. With this configuration, the influence of any parasitic capacitance can be reduced. However, the configuration of the injection locked frequency divider that inputs the signal from the source of the N-channel MOS transistor is disclosed in Patent Literature 1.

Figure 7:
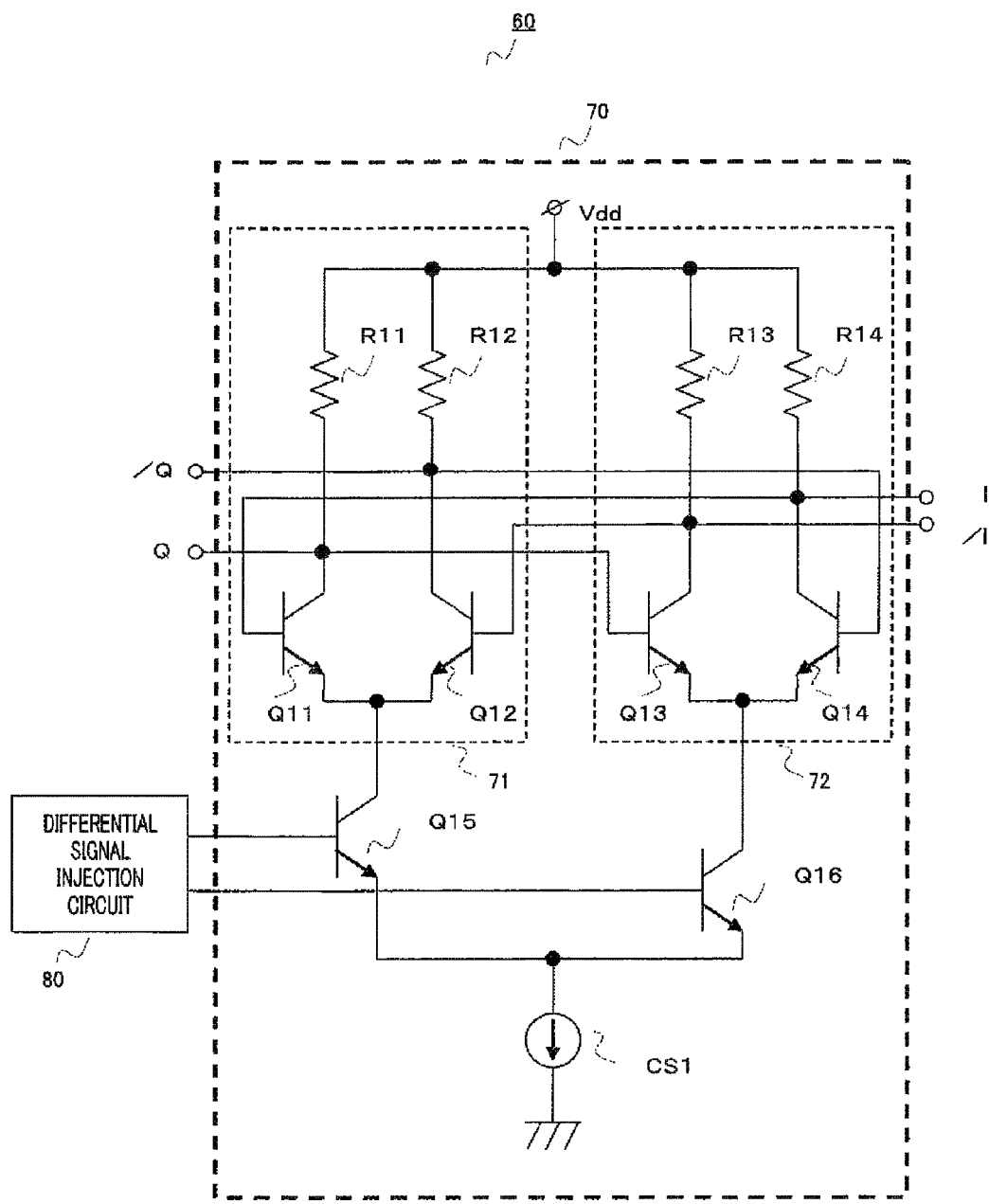
FIG. 7 a circuit diagram showing configuration of conventional injection locked frequency divider 2.

FIG. 7 is a circuit diagram showing the configuration of injection locked frequency divider 60 described in Patent Literature 1.

As shown in FIG. 7, injection locked frequency divider 60 includes ring oscillator 70 that cascade-connects fourth amplifier circuit 71 and fifth amplifier circuit 72 in two stages in a ring and differential signal injection circuit 80.

Fourth amplifier circuit 71 includes pair of N-channel MT (Bipolar Junction Transistor) differential transistors Q11 and Q12 and resistors R11 and R12.

The feedback output of fifth amplifier circuit 72 is inputted to the bases of pair of N-channel BJT differential transistors Q11 and Q12. Resistors R11 and R12 function as a load.

Fifth amplifier circuit 72 includes pair of N-channel BJT differential transistors Q13 and Q14 and resistors R13 and R14. The output of fourth amplifier circuit 71 is inputted to the bases of pair of N-channel BJT differential transistors Q13 and Q14. Resistors R13 and R14 function as a load.

An electric current is supplied from constant current source CS1 via pair of differential transistors Q15 and Q16 to ring oscillator 70.

Differential signal injection circuit 80 is connected to the bases of pair of differential transistors Q15 and Q16, and a differential signal is inputted thereto.

Resistors R11, R12, R13, and R14 are connected to high potential power source Vdd.

The operation of injection locked frequency divider 60 will be described.

Figures 8, 9:
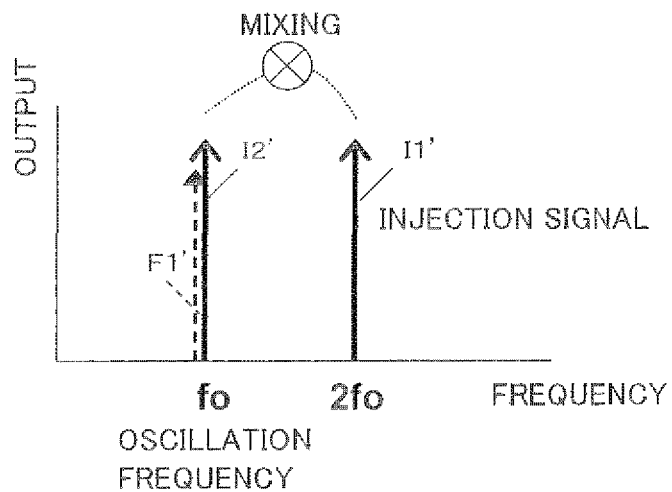
FIG. 8 is a diagram showing the frequencies of the output signal of conventional injection locked frequency divider 2.
FIG. 9 is a diagram showing the phases in the respective stages of a ring oscillator of conventional injection locked frequency divider 2.

FIG. 8 is a diagram showing the frequencies of the output signal of injection locked frequency divider 60.

As shown in FIG. 8, when the injection signal from signal injection circuit 80 is not inputted (there is not the dashed line injection signal in frequency $2f_o$), oscillation signal F1' (dashed line) of free-running frequency fo occurs in the output of ring oscillator 70.

Next, when injection signal I1' from differential signal injection circuit 80 is the signal (solid line) near frequency $2f_o$, output signal I2' (solid line) occurs near free-running frequency fo.

Output signal I2' (solid line) is the signal provided by down-converting injection signal I1' by mixing of injection signal I1' and oscillation signal F1'.

Thereby, oscillation signal F1' of ring oscillator 70 is drawn to and synchronized with the frequency of output signal I2'.

In this way, injection signal I1' in which the phases near frequency $2f_o$ are differential is inputted so that injection signal I1' is down-converted to provide output signal I2' near free-running frequency fo. Therefore, injection locked frequency divider 60 is operated as a frequency divider for ½ frequency division.

The phases of oscillation signal F1' in the respective stages of ring oscillator 70 are shown in FIG. 9.

FIG. 9 is a diagram showing the phases in the collector outputs of the respective N-channel BJT transistors of ring oscillator 70.

As shown in FIG. 9, in the phases of the second-order harmonic component, oscillation signal F1' is doubled in the respective stages. Therefore, the phases in the first stage and the second stage have phase rotations of 0° and ±180° respectively, and are differential. That is, it suffices that injection signal has the differential phases in the first stage and the second stage, and can be inputted via pair of differential transistors Q15 and Q16.

In this way, in injection locked frequency divider 60 described in Patent Literature 1, the phases in the first and the second stages of the frequency signal having a frequency even number times oscillation frequency fo of ring oscillator 70 have phase rotations of 0° and ±180° respectively, and are differential. Therefore, injection locked frequency divider 60 can be operated as an even-number frequency divider by inputting the frequency signal having a frequency even number times oscillation frequency fo. The frequency signal having a frequency even number times oscillation frequency fo is inputted from differential signal injection circuit 80 via pair of differential transistors Q15 and Q16. However, the phases of the frequency signal having a frequency odd number times oscillation frequency fo of ring oscillator 70 are differential in N-channel BJT transistors Q11 and Q12 in the first stage and N-channel BJT transistors Q13 and Q14 in the second stage, respectively.

For instance, in the frequency signal of $3f_o$, the phases of Q11, Q12, Q13, and Q14 have phase rotations of 0°, ±180°, ±270°, and ±90° respectively.

Therefore, since injection locked frequency divider 60 described in Patent literature 1 is difficult to input the signal via pair of differential transistors Q15 and Q16, it is difficult to be operated as an odd-number frequency divider.

In addition, ring oscillator 70 adds a pair of differential transistors between each of amplifier circuits 71 and 72 and constant current source CS1. To be operated, ring oscillator 70 is required to be connected to a higher potential power source, and is not suitable for lowered voltage and reduced power consumption.

This embodiment can realize the injection locked frequency divider that can solve the problem of injection locked frequency divider 10 of Non-Patent Literature 1, that is, has a wide operating frequency bandwidth and can reduce the influence of any parasitic capacitance caused between the wires and the substrate.

In addition, in this embodiment, the differential signal is inputted to the gates of P-channel MOS transistors 112, 122, and 132 and the gate of N-channel MOS transistor 150 of the constant current source. Thereby, injection locked frequency divider 100 can add one transistor, and can realize an odd-number frequency divider that can be operated even by a low voltage power source.

Next, the operation of injection locked frequency divider 100 of this embodiment will be described in detail.

Figure 10:
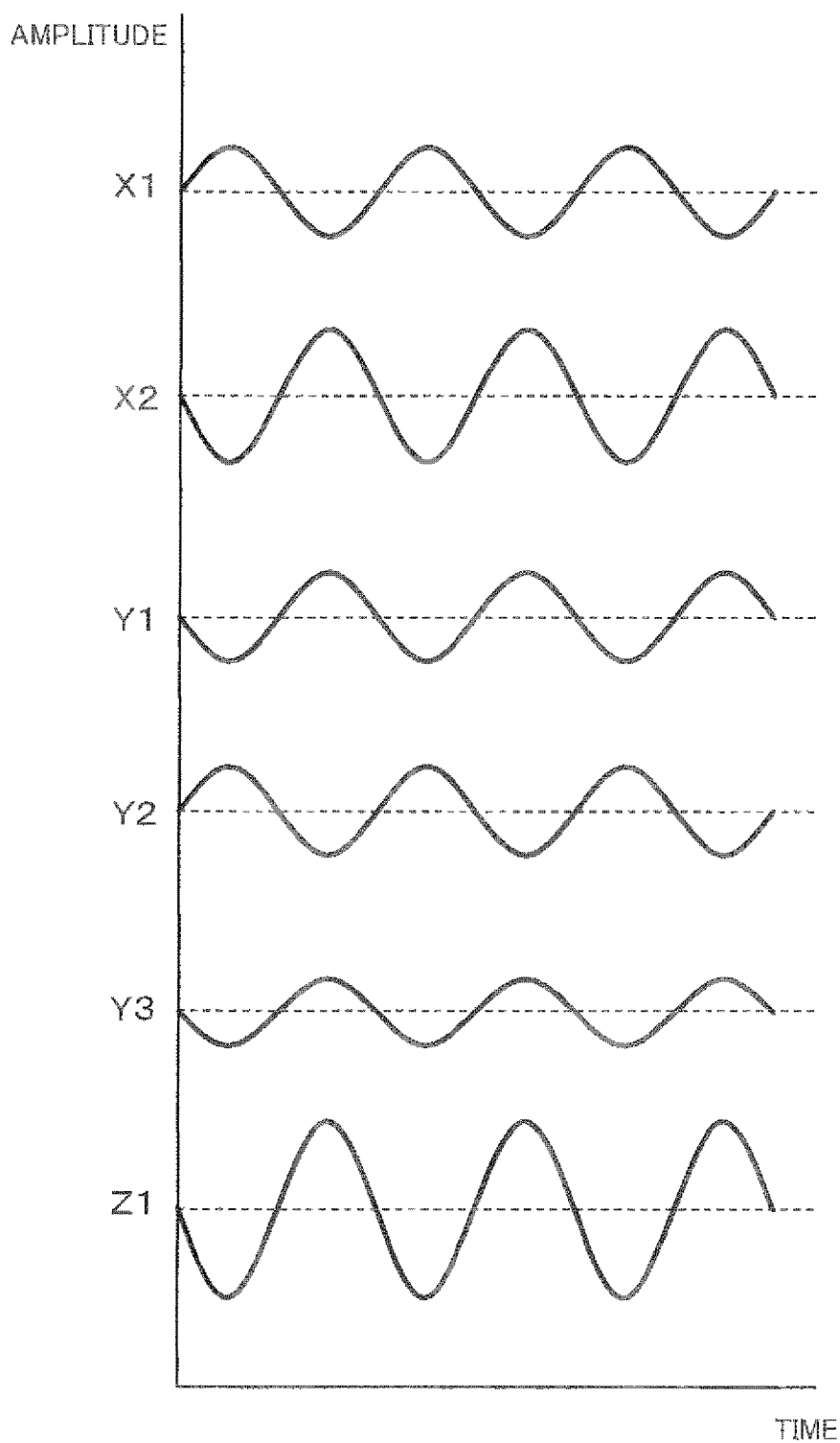
FIG. 10 is a diagram showing the phases changed by the time an injection signal of the injection locked frequency divider according to Embodiment 1 is transmitted to its output.

FIG. 10 is a diagram showing the phases changed by the time the injection signal of injection locked frequency divider 100 is transmitted to its output. Signal X1, signal X2, signal Y1, signal Y2, signal Y3, and signal Z1 of FIG. 10 show signal X1, signal X2, signal Y1, signal Y2, signal Y3, and signal Z1 of the respective sections of FIG. 6.

As shown in FIG. 6, differential signal injection circuit 160 outputs signal X1 to the gates of P-channel MOS transistors 112, 122, and 132 in the respective stages, and outputs differential signal Y1 of reverse phase of signal X1 to the gate of N-channel MOS transistor 150.

Signal X2, signal Y2, and signal Y3 of FIGS. 6 and 10 are the signals of the respective sections of third amplifier circuit 143 in the output stage, and signal Z1 is the output signal of injection locked frequency divider 100.

Figure 2:
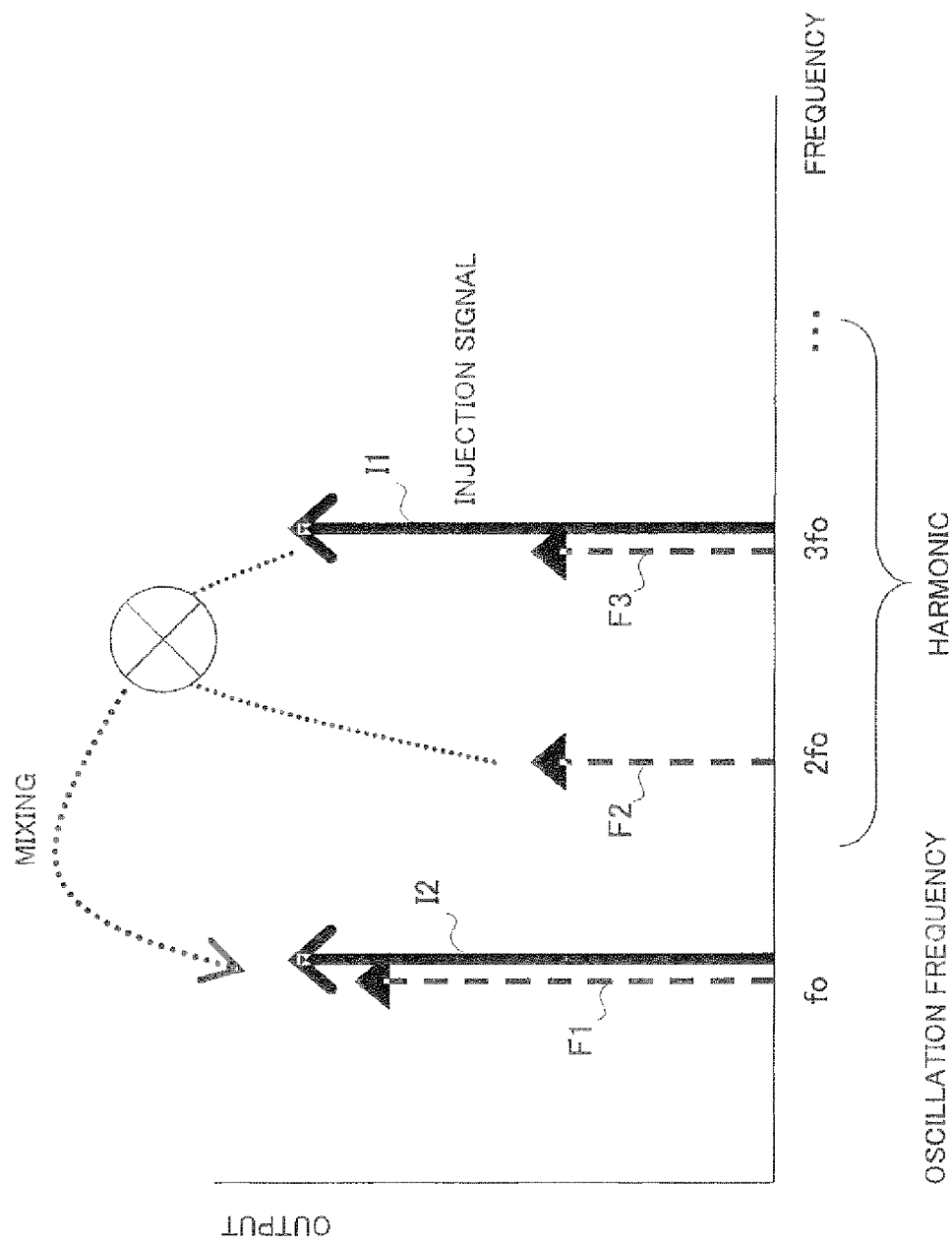
FIG. 2 is a diagram showing the frequencies of the output signal of conventional injection locked frequency divider 1.

As shown in FIG. 2, first, when the injection signal from differential signal injection circuit 160 is not inputted (there is not the dashed line injection signal in frequency $3fo$), oscillation signal F1 (dashed line) of free-running frequency fo, second-order harmonic component F2 (dashed line) of frequency $2fo$, and third-order harmonic component F3 (dashed line) of frequency $3fo$ occur in the output of ring oscillator 140.

Next, when injection signal I1 (solid line) from differential signal injection circuit 160 is the signal near frequency $3fo$, the phases in the respective stages changed by the time injection signal T1 is transmitted to the output of injection locked frequency divider 100 are in phase, as shown in FIG. 10. Here, the phases of the output stage will be described.

Signal X1 is inputted from differential signal injection circuit 160 to the gates of P-channel MOS transistors 112, 122, and 132 of ring oscillator 140. The drain of P-channel MOS transistor 132 in the output stage of ring oscillator 140 outputs signal X2. Signal X2 is the signal amplified based on reversed signal X1.

In addition, the signal inputted to the gate of N-channel MOS transistor 150 is outputted via signal Y1, signal Y2, and signal Y3. Since reverse is repeated twice in the respective stages, signal Y3 and signal Y1 are in phase.

Signal Z1 that is the output of ring oscillator 140 (that is, the output of injection locked frequency divider 100) is the signal output of the sum of signal X2 and signal Y3. As shown in FIG. 10, signal Z1 becomes a signal having large amplitude by addition since signal X2 and signal Y3 are in phase.

Injection locked frequency divider 100 can compensate for the attenuation of output signal Z1 by increasing the signal level of output signal Z1 using signal X2 and signal Y3.

Injection signal I1 (frequency $3fo$) and second-order harmonic component F2 (frequency $2fo$) are mixed so that output signal I2 provided by down-converting injection signal I1 occurs near free-running frequency F1 (fo). Therefore, free-running frequency F1 (dashed line) of ring oscillator 140 is drawn to and synchronized with the frequency of output signal I2 (solid line). It is to be noted that output signal I2 corresponds to output signal Z1 of FIG. 6.

Here, as described above, since injection signal I1 is difficult to be attenuated even when any parasitic capacitance component occurs, the amplitude of output signal I2 down-converted becomes larger so that the operating frequency bandwidth of the injection locked frequency divider is widened.

Figure 11:
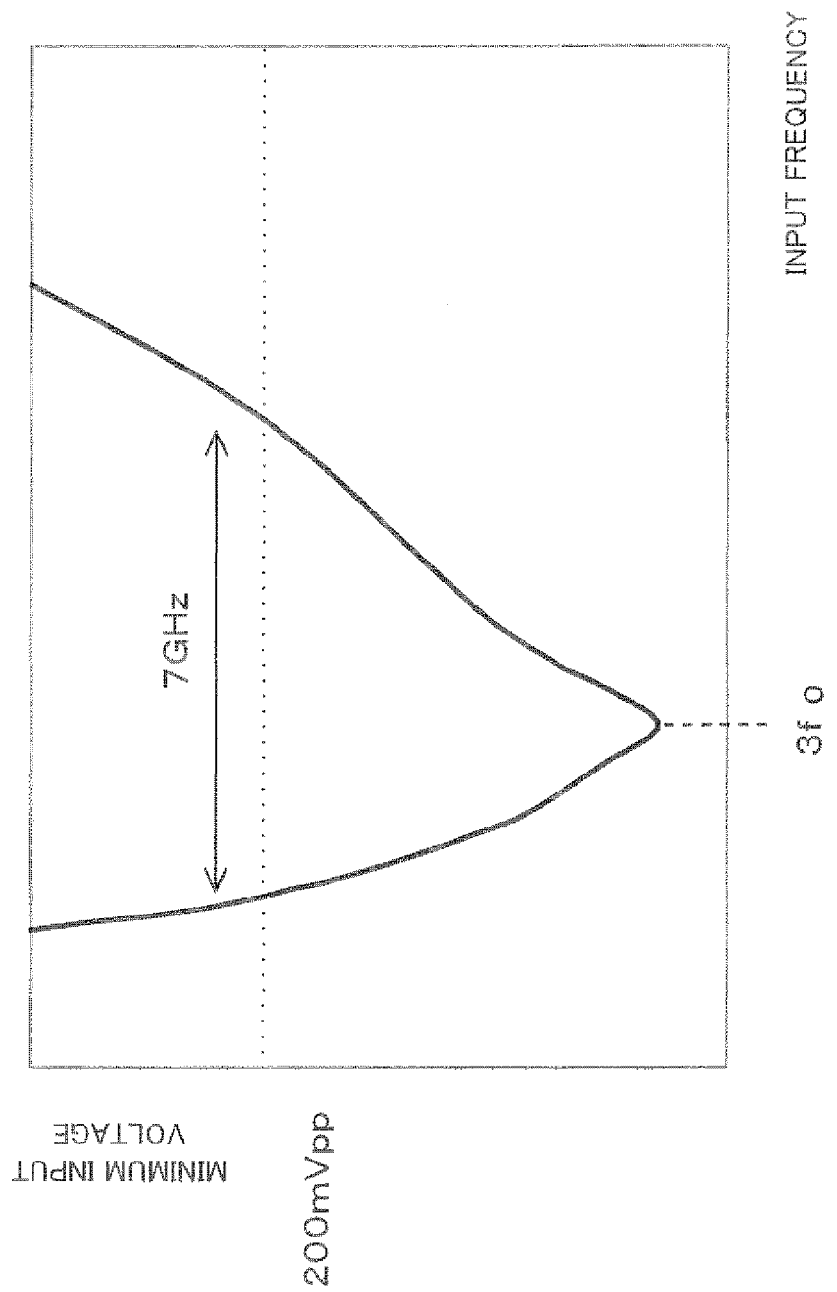
FIG. 11 is a diagram showing the frequency characteristic of the voltage amplitude of injection signal I1 from a differential signal injection circuit necessary for stable synchronization of the injection locked frequency divider according to Embodiment 1.

FIG. 11 is a diagram showing the frequency characteristic of the voltage amplitude of injection signal I1 from differential signal injection circuit 160 necessary for stable synchronization of injection locked frequency divider 100.

Figure 4:
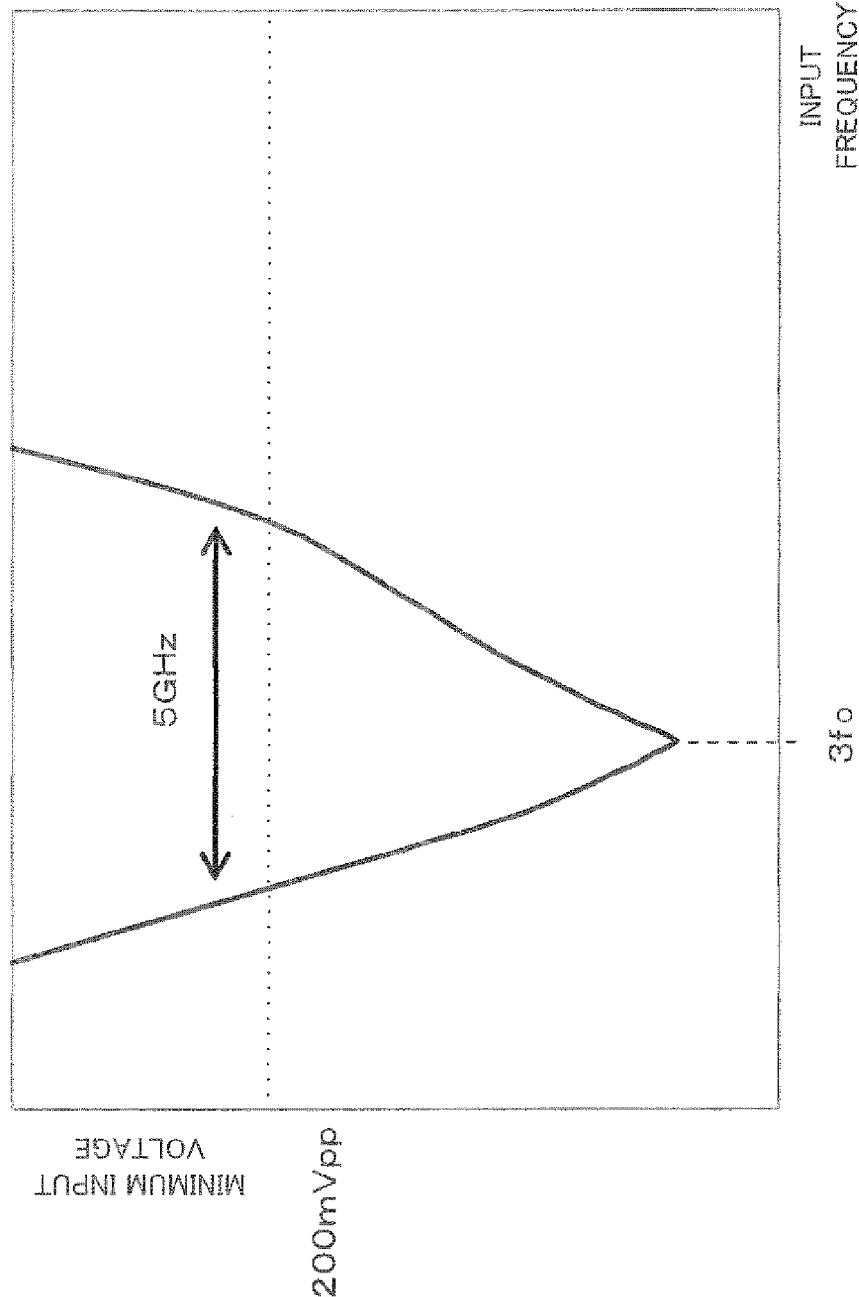
FIG. 4 is a diagram showing the frequency characteristic of the voltage amplitude of injection signal I1 from a signal injection circuit necessary for stable synchronization of conventional injection locked frequency divider 1.
Figure 5:
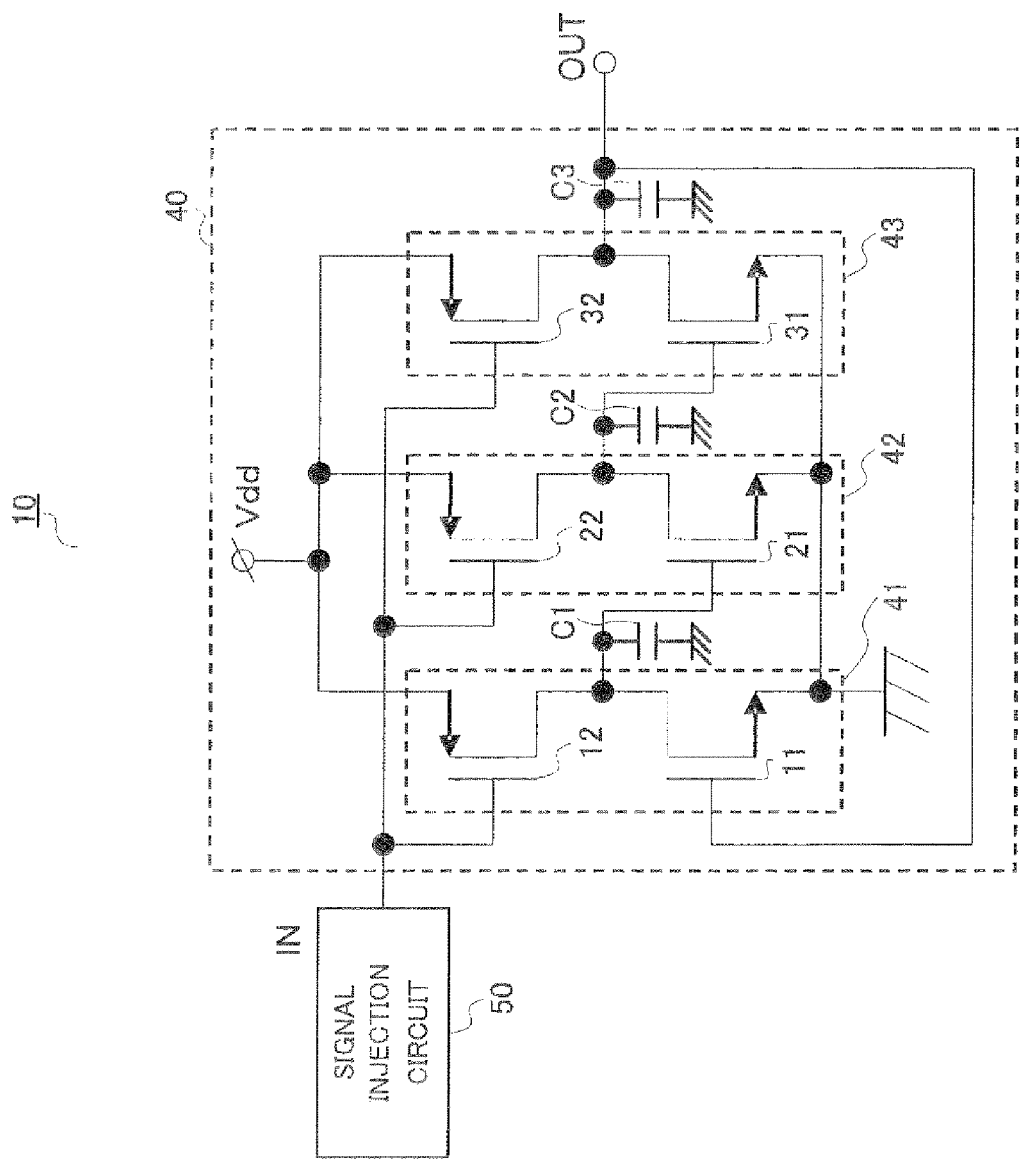
FIG. 5 is a circuit block diagram including parasitic capacitance components in conventional injection locked frequency divider 1.

As shown in FIG. 11, in ring oscillator 140, the voltage amplitude of the operable injection signal becomes minimum near the frequency three times free-running frequency fo. Ring oscillator 140 can be operated in a wide frequency bandwidth of about 7 GHz at voltage amplitude of 200 mVpp. In particular, as understood from the comparison of injection locked frequency divider 100 with conventional injection locked frequency divider 10 of FIG. 4, for instance, the frequency bandwidth can be increased by about 2 GHz at 200 mVpp.

As described above, according to this embodiment, injection locked frequency divider 100 includes ring oscillator 140 that cascade-connects first amplifier circuit 141, second amplifier circuit 142, and third amplifier circuit 143 in three stages in a ring, N-channel MOS transistor 150, and differential signal injection circuit 160.

First amplifier circuit 141 includes N-channel MOS transistor 111 and P-channel MOS transistor 112. The feedback output of third amplifier circuit 143 is inputted to the gate of N-channel MOS transistor 111. P-channel MOS transistor 112 functions as a load.

Second amplifier circuit 142 includes N-channel MOS transistor 121 and P-channel MOS transistor 122. The output of first amplifier circuit 141 is inputted to the gate of N-channel MOS transistor 121. P-channel MOS transistor 122 functions as a load.

Third amplifier circuit 143 includes N-channel MOS transistor 131 and P-channel MOS transistor 132. The output of second amplifier circuit 142 is inputted to the gate of N-channel MOS transistor 131. P-channel MOS transistor 132 functions as a load.

The drain of N-channel MOS transistor 150 is connected to the sources of N-channel MOS transistors 111, 121, and 131 in the respective stages.

Differential signal injection circuit 160 outputs injection signal T1 to the gates of P-channel MOS transistors 112, 122, and 132 in the respective stages. Differential signal injection circuit 160 outputs a reverse phase signal of injection signal I1 as a differential signal to the gate of N-channel MOS transistor 150.

That is, in this embodiment, the differential signal is inputted to the gates of P-channel MOS transistors 112, 122, and 132 and the gate of N-channel MOS transistor 150 of the constant current source.

With this configuration, injection locked frequency divider 100 strengthens the injection signal and the differential signal mutually using differential signal injection circuit 160 and first N-channel MOS transistor 150. That is, as shown by signal Z1 of FIG. 10 the injection signal and the differential signal inputted from differential signal injection circuit 160 are in phase in the output stage of ring oscillator 140 and are strengthened mutually. Therefore, the influence of any parasitic capacitance can be reduced, so that a wide operating frequency bandwidth can be secured. In FIG. 6, the injection locked frequency divider that performs ⅓ frequency division and has a wide operating frequency bandwidth can be realized.

In addition, injection locked frequency divider 100 can add one transistor, and can realize an odd-number frequency divider that can be operated even by a low voltage power source.

Injection locked frequency divider 100 of this embodiment is particularly effective when the input is the differential signal and the output is the single signal, and can realize a frequency divider that enables a wide frequency bandwidth operation without increasing its circuit size.

In addition, injection locked frequency divider 100 can be realized by a very simplified circuit configuration, and can be easily embodied with a fewer number of components.

Further, although in this embodiment, the number of stages in ring oscillator 140 is three, the present invention is not limited to this, the number of stages in ring oscillator 140 may be (2n+1), and the frequency of the injection signal from differential signal injection circuit 160 may be near in (2n+1) times free-running frequency fo of the ring oscillator.

For instance, the number of stages in the ring oscillator may be five, and differential signal injection circuit 160 may output a signal having a frequency substantially five or ten times oscillation frequency of the five-stage ring oscillator. Injection locked frequency divider 100 can be operated as an injection locked frequency divider for m (2n+1) frequency division, and can obtain the same effect.

In addition, in this embodiment, the bias voltage of the gates of P-channel MOS transistors 112, 122, and 132 of ring oscillator 140 is controlled so that free-running frequency fo of ring oscillator 140 can be adjusted.

In addition, it suffices that ring oscillator 140 cascade-connects odd-numbered stages in a ring, and can use a NAND or NOR configuration functioning as an inverter without limiting the gate type, thereby enabling the same operation.

Embodiment 2

Figure 12:
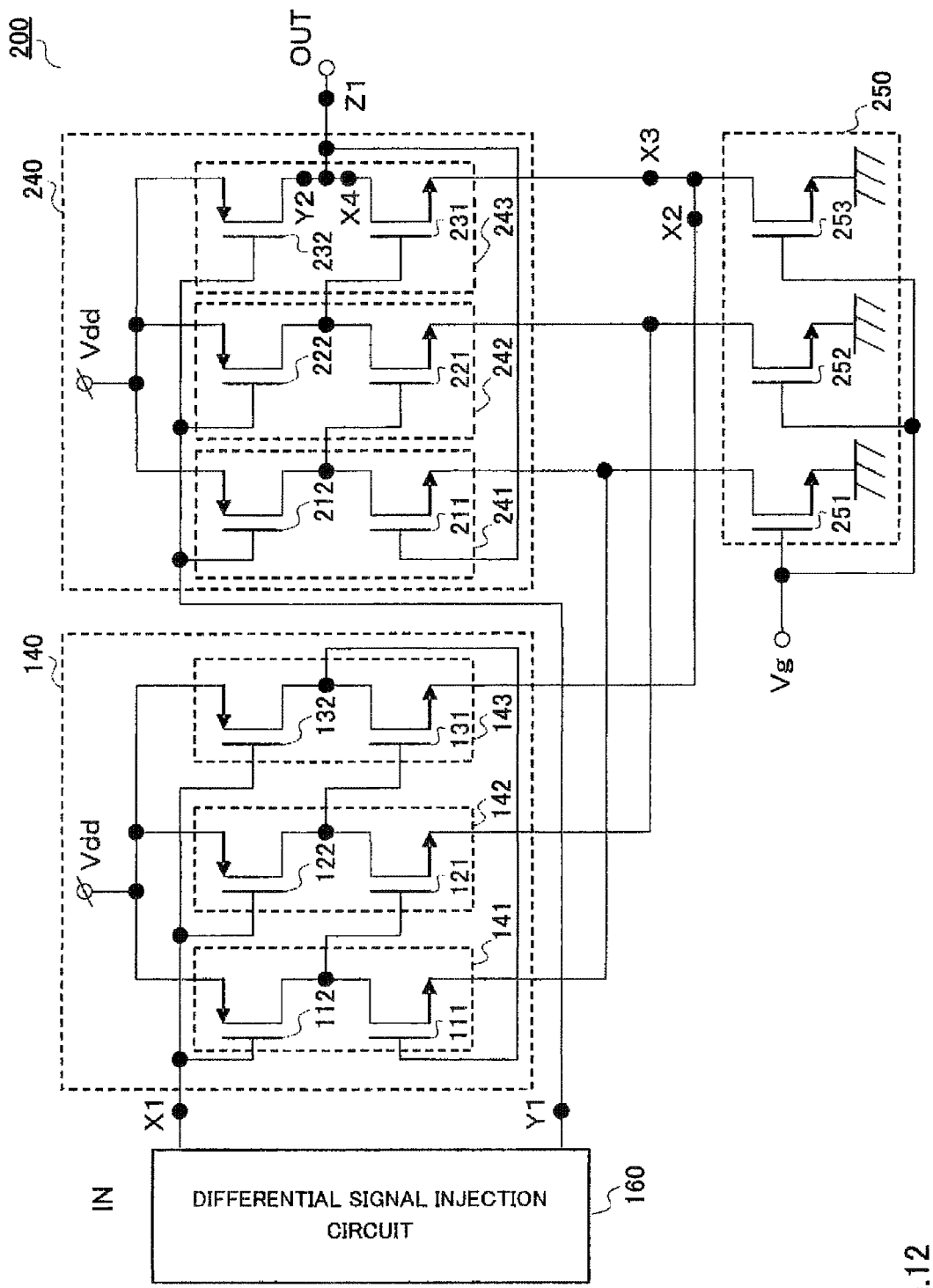
FIG. 12 is a circuit diagram showing configuration of an injection locked frequency divider according to Embodiment 2 of the present invention.

FIG. 12 is a circuit diagram showing the configuration of an injection locked frequency divider according to Embodiment 2 of the present invention. The same configuration parts as FIG. 6 are indicated by the same reference numerals and the description of the overlapped parts is omitted.

As shown in FIG. 12, injection locked frequency divider 200 includes ring oscillator 140 of FIG. 6 (for ease of explanation, called first ring oscillator 140), second ring oscillator 240 having the same configuration as first ring oscillator 140, and electric current source 250.

Electric current source 250 includes N-channel MOS transistors 251, 252, and 253.

N-channel MOS transistors 251, 252, and 253 combine and connect the sources of the N-channel MOS transistors in the respective stages of first and second ring oscillators 140 and 240 to the drains.

In addition, injection locked frequency divider 200 includes differential signal injection circuit 160 that inputs injection signal X1 to the gates of P-channel MOS transistors 112, 122, and 132 of first ring oscillator 140 and inputs reverse phase signal Y1 of injection signal X1 as a differential signal to the gates of P-channel MOS transistors 212, 222, and 232 of second ring oscillator 240.

Second ring oscillator 240 cascade-connects first amplifier circuit 241, second amplifier circuit 242, and third amplifier circuit 243 in three stages in a ring.

First amplifier circuit 241 includes N-channel MOS transistor 211 and P-channel MOS transistor 212. The gate of N-channel MOS transistor 211 receives the feedback output of third amplifier circuit 243. P-channel MOS transistor 212 is a load.

Second amplifier circuit 242 includes N-channel MOS transistor 221 and P-channel MOS transistor 222. The gate of N-channel MOS transistor 221 receives the output of first amplifier circuit 241. P-channel MOS transistor 222 is a load.

Third amplifier circuit 243 includes N-channel MOS transistor 231 and P-channel MOS transistor 232. The gate of N-channel MOS transistor 231 receives the output of second amplifier circuit 242. P-channel MOS transistor 232 is a load.

The sources of P-channel MOS transistors 112, 122, 132, 212, 222, and 232 in the respective stages of first and second ring oscillators 140 and 240 are connected to high potential power source Vdd. In addition, bias voltage Vg is supplied to the gates of N-channel MOS transistors 251, 252, and 253 of electric current source 250, and the sources are grounded.

The drain of N-channel MOS transistor 231 and the drain of P-channel MOS transistor 232 of third amplifier circuit 243 of second ring oscillator 240 are connected to become the output of injection locked frequency divider 200.

Hereinafter, the operation of injection locked frequency divider 200 configured as described above will be described.

Figure 13:
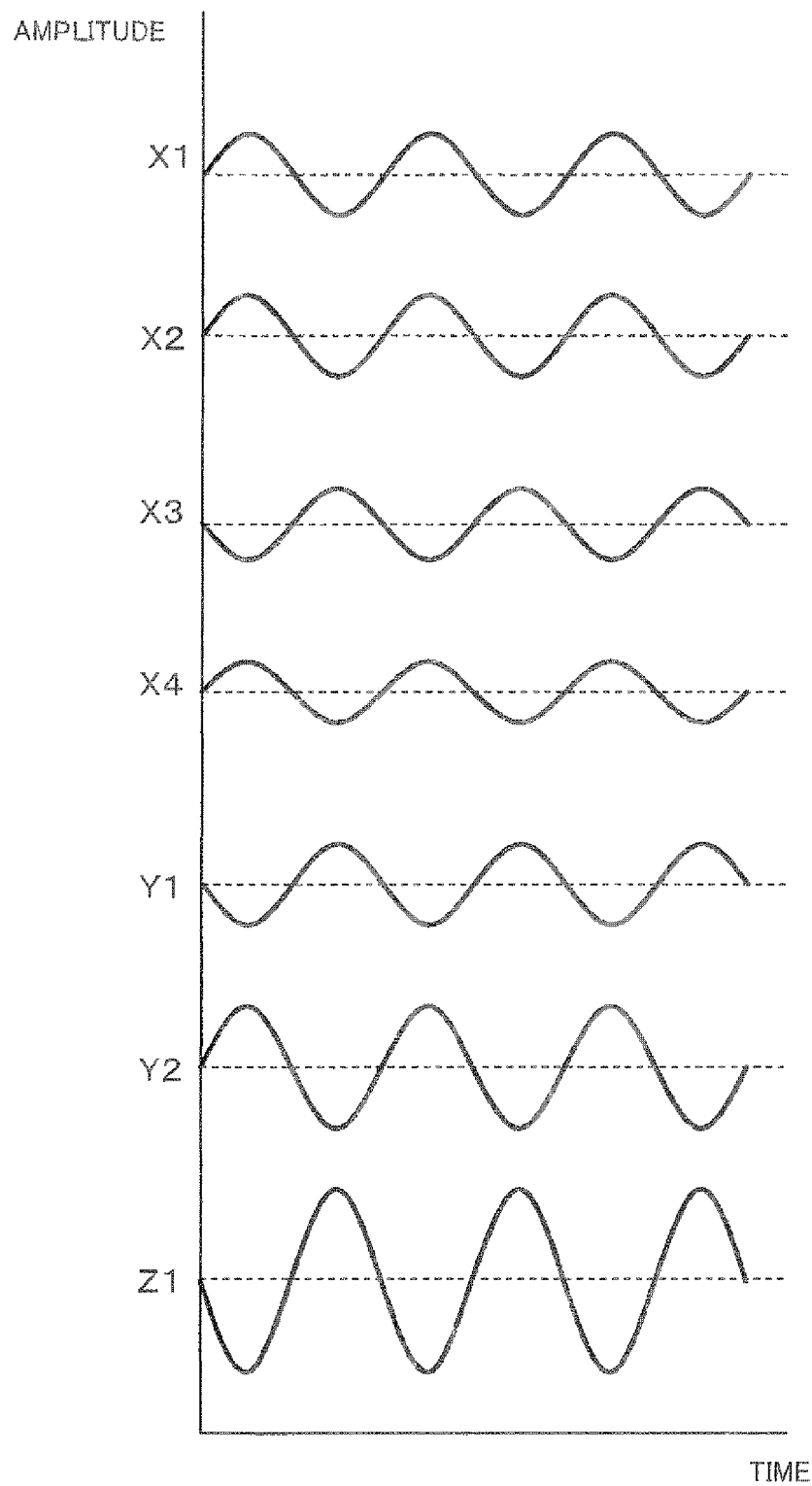
FIG. 13 is a diagram showing the phases changed by the time an injection signal of the injection locked frequency divider according to Embodiment 2 is transmitted to its output.

FIG. 13 is a diagram showing the phases changed by the time the injection signal of injection locked frequency oscillator 200 is transmitted to its output. Signal X1, signal X2, signal X3, signal X4, signal Y1, signal Y2, and signal Z1 of FIG. 13 show signal X1, signal X2, signal X3, signal X4, signal Y1, signal Y2, and signal Z1 of the respective sections of FIG. 12.

As shown in FIG. 13, differential signal injection circuit 160 outputs signal X1 to the gates of P-channel MOS transistors 112, 122, and 132 in the respective stages of first ring oscillator 140, and outputs differential signal Y1 of reverse phase of signal X1 to the gates of P-channel MOS transistors 212, 222, and 232 of second ring oscillator 240.

Signal X2 and signal X3 of FIGS. 12 and 13 are the source potentials of N-channel MOS transistors 131 and 231 of third amplifier circuits 143 and 243 of first and second ring oscillators 140 and 240.

In addition, signal Y2 and signal X4 of FIGS. 12 and 13 are the signals of the respective sections of third amplifier circuit 243 of second ring oscillator 240 in the output stage, and signal Z1 is the output signal of injection locked frequency divider 200.

As shown in FIG. 2, first, when the injection signal from differential signal injection circuit 160 is not inputted (there is not the dashed line injection signal in frequency $3fo$), oscillation signal F1 (dashed line) of free-running frequency fo, second-order harmonic component F2 (dashed line) of frequency $2fo$, and third-order harmonic component F3 (dashed line) of frequency $3fo$ occur in the output of second ring oscillator 240.

Next, when injection signals X1 and Y1 near frequency $3fo$ from differential signal injection circuit 160 are inputted, the phases changed by the time injection signals X1 and Y1 are transmitted to the output of ring oscillator 240 are shown in FIG. 13 and are in phase in the respective stages of second ring oscillator 240.

The phases of the output stage will be described.

The signal inputted to the gates of P-channel MOS transistors 112, 122, and 132 of first ring oscillator 140 is outputted via signals X1 to X4. First, since the phase is reversed twice from signal X1 to signal X2, the phase in not changed. Next, first and second ring oscillators 140 and 240 are connected by constant current source 250, and since signal X2 and signal X3 are differential, the phase is reversed. Further, the phase is reversed from signal X3 to signal X4.

Next, the signal inputted to the gates of P-channel MOS transistors 212, 222, and 232 of second ring oscillator 240 is outputted via signal Y1 and signal Y2. Signal Y2 is amplified based on reversed signal Y1.

As a result, the signal of the sum of signal X4 and signal Y2 is outputted to the output of second ring oscillator 240, and becomes signal Z1 having a large amplitude since signal X4 and signal Y2 are in phase. The signal level of signal Z1 is increased using signal X2 and signal Y3 so that the attenuation of signal Z1 can be compensated for.

Although only the output stage has been described here, there is the same compensating effect in all stages. Since the influence of any parasitic component can be reduced, the operating frequency bandwidth of the injection locked frequency divider can be widened.

In this way, in injection locked frequency divider 200 of this embodiment, first and second ring oscillators 140 and 240 have the differential configuration using electric current source 250. Therefore, injection locked frequency divider 200 can reduce the influence of any parasitic component, and can realize an injection locked frequency divider that performs ⅓ frequency division and has a wide operating frequency bandwidth.

In particular, injection locked frequency divider 200 of this embodiment is particularly effective when the input signal is the differential signal and the output signal is the differential signal or the single signal, and can realize a frequency divider that enables a wide frequency bandwidth operation.

Further, although in this embodiment, N-channel MOS transistors 251, 252, and 253 are used as constant current source 250, injection locked frequency divider 200 can be operated as the injection locked frequency divider by using a passive element including a resistor or an inductor. Injection locked frequency divider 200 can realize a more simplified and smaller circuit configuration by using the passive element.

In addition, although in this embodiment, as in Embodiment 1, the number of stages in each of first and second ring oscillators 140 and 240 is three, the present invention is not limited to this, and the number of stages in each of first and second ring oscillators 140 and 240 may be (2n+1), and the frequency of the injection signal from differential signal injection circuit 160 may be near m (2n+1) times free-running frequency fo of the ring oscillator. Thereby, injection locked frequency divider 200 can be operated as an injection locked frequency divider for m (2n+1) frequency division, and can obtain the same effect.

In addition, in this embodiment, the bias voltage of the gates of P-channel MOS transistors 112, 122, 132, 212, 222, and 232 of ring oscillators 140 and 240 is controlled so that free-running frequency fo of ring oscillators 140 and 240 can be adjusted.

Embodiment 3

Figure 14:
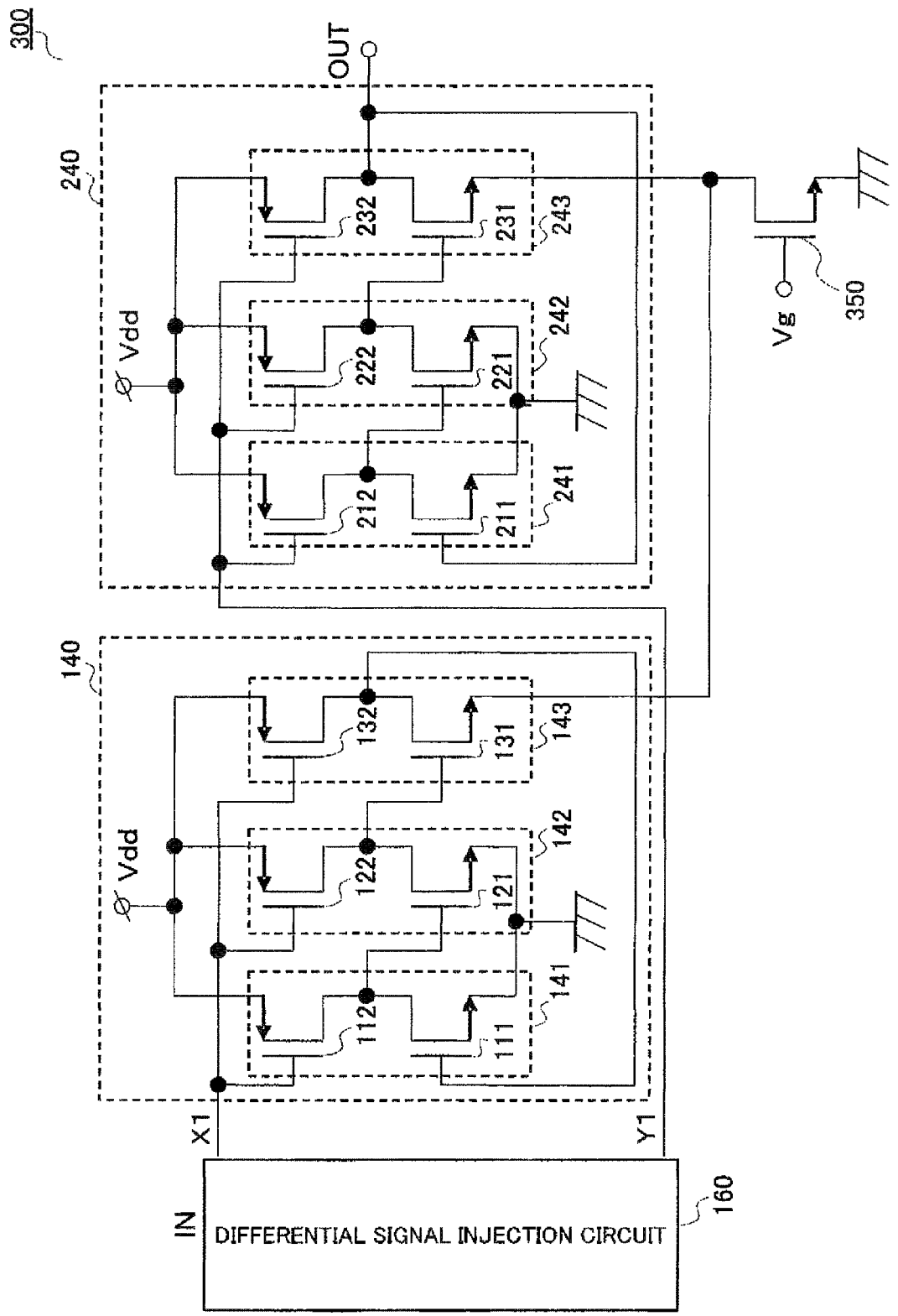
FIG. 14 is a circuit diagram showing configuration of an injection locked frequency divider according to Embodiment 3 of the present invention.

FIG. 14 is a circuit diagram showing the configuration of an injection locked frequency divider according to Embodiment 3 of the present invention. The same configuration parts as FIG. 12 are indicated by the same reference numerals and the description of the overlapped parts is omitted.

As shown in FIG. 14, injection locked frequency divider 300 includes first ring oscillator 140, second ring oscillator 240 having the same configuration as first ring oscillator 140, N-channel MOS transistor 350 that is an electric current source, and differential signal injection circuit 160.

N-channel MOS transistor 350 as the electric current source combines and connects the sources of N-channel MOS transistors 131 and 231 in the output stages of first and second ring oscillators 140 and 240 to the drain.

Differential signal injection circuit 160 outputs injection signal I1 to the gates of P-channel MOS transistors 112, 122, and 132 of first ring oscillator 140, and outputs a reverse phase signal of injection signal I1 as a differential signal to the gates of P-channel MOS transistors 212, 222, and 232 of second ring oscillator 240.

Injection locked frequency divider 300 is the same as injection locked frequency divider 200 of FIG. 12 except that N-channel MOS transistor 350 as the electric current source is connected only to the output stage.

Hereinafter, the operation of injection locked frequency divider 300 as described above will be described. The basic operation thereof is the same as Embodiment 2.

When the injection signal from differential signal injection circuit 160 is not inputted, as shown in FIG. 2, oscillation signal F1 (dashed line) of free-running frequency fo, second-order harmonic component F2 (dashed line) of frequency 2fo, and third-order harmonic component F3 (dashed line) of frequency 3fo occur in the output of second ring oscillator 240.

Next, when injection signals X1 and Y1 from differential signal injection circuit 160 near frequency 3fo is inputted, the signal via P-channel MOS transistor of first ring oscillator 140 and the signal via P-channel MOS transistor of second ring oscillator 240 are in phase in the output of injection locked frequency divider 300 so that the amplitude can become larger.

The amplitude of the signal in the output of injection locked frequency divider 300 is increased so that the attenuation of the injection signal due to any parasitic capacitance component can be compensated for. That is, even when the injection signal is attenuated due to any parasitic capacitance component, the attenuation of the injection signal is compensated for by increasing the amplitude of the signal level in the output of injection locked frequency divider 300.

Here, a phase rotation of 120° is present in the phases in the respective stages of first and second ring oscillators 140 and 240. It is to be noted that injection locked frequency divider 300 can be operated even when each of their rotation directions is opposite.

In this way, injection locked frequency divider 300 of this embodiment has the differential configuration using electric current source 350 as the output stage of first and second ring oscillators 140 and 240. Therefore, the number of MOS transistors used as electric current source 350 can be reduced. As a result, injection locked frequency divider 300 can reduce the influence of any parasitic component without increasing its circuit size, and can realize an injection locked frequency divider that performs ⅓ frequency division and has a wide operating frequency bandwidth.

Injection locked frequency divider 300 of this embodiment is particularly effective when the input signal is the differential signal and the output signal is the differential signal or the single signal, and can realize a frequency divider that enables a wide frequency bandwidth operation without increasing its circuit size.

In addition, although in this embodiment, the output stage of the amplifier circuits of first and second ring oscillators 140 and 240 has the differential configuration using electric current source 350, the present invention is not limited to this, and other amplifier circuits other than the output stage may have the differential configuration. The effect of increasing the freedom of design can be expected.

Further, although in this embodiment, N-channel MOS transistor 350 is used as the electric current source, injection locked frequency divider 300 can be operated as the injection locked frequency divider even using a passive element including a resistor or an inductor. Injection locked frequency divider 300 can realize a more simplified and smaller circuit configuration by using the passive element.

In addition, although in this embodiment, as in Embodiments 1 and 2, the number of stages in each of first and second ring oscillators 140 and 240 is three, the present invention is not limited to this, the number of stages in each of first and second ring oscillators 140 and 240 may be (2n+1), and the frequency of the injection signal from differential signal injection circuit 160 may be near m (2n+1) times free-running frequency fo of the ring oscillator. Injection locked frequency divider 300 can be operated as an injection locked frequency divider for in (2n+1) frequency division, and can obtain the same effect.

In addition, in this embodiment, the bias voltage of the gates of P-channel MOS transistors 112, 122, 132, 212, 222, and 232 of ring oscillators 140 and 240 is controlled so that free-running frequency fo of ring oscillators 140 and 240 can be adjusted.

Embodiment 4

Figure 15:
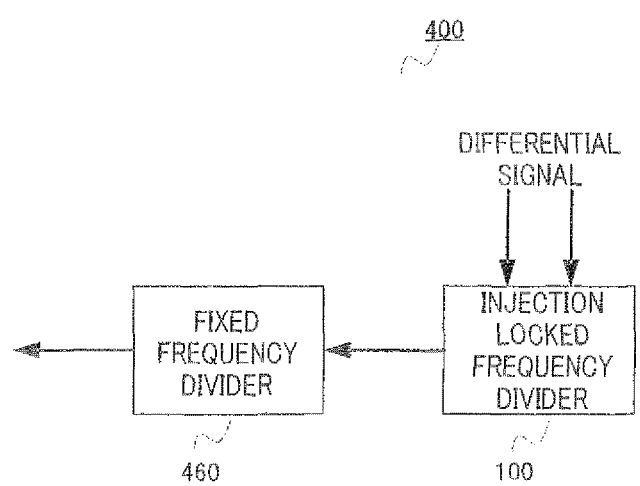
FIG. 15 is a diagram showing configuration of a fixed frequency divider circuit (prescaler) according to Embodiment 4 of the present invention.

FIG. 15 is a diagram showing the configuration of a fixed frequency divider circuit (prescaler) according to Embodiment 4 of the present invention.

As shown in FIG. 15, fixed frequency divider circuit 400 includes injection locked frequency divider 100 of FIG. 6 and fixed frequency divider 460.

Next, the operation of fixed frequency divider circuit 400 will be described.

The high frequency differential signal is frequency-divided to the signal of the single output by injection locked frequency divider 100. The signal of the single output is frequency-divided to a low frequency by fixed frequency divider 460.

In this way, fixed frequency divider circuit 400 of this embodiment uses injection locked frequency divider 100 of Embodiment 1 as injection locked frequency divider 100 of the fixed frequency divider circuit. The output of injection locked frequency divider 100 and the input of fixed frequency divider 460 in the later stage can be configured by using the signal of the single output, so that the fixed frequency divider circuit that has a wide operating frequency bandwidth, is small, and can reduce power consumption can be realized.

Embodiment 5

Figure 16:
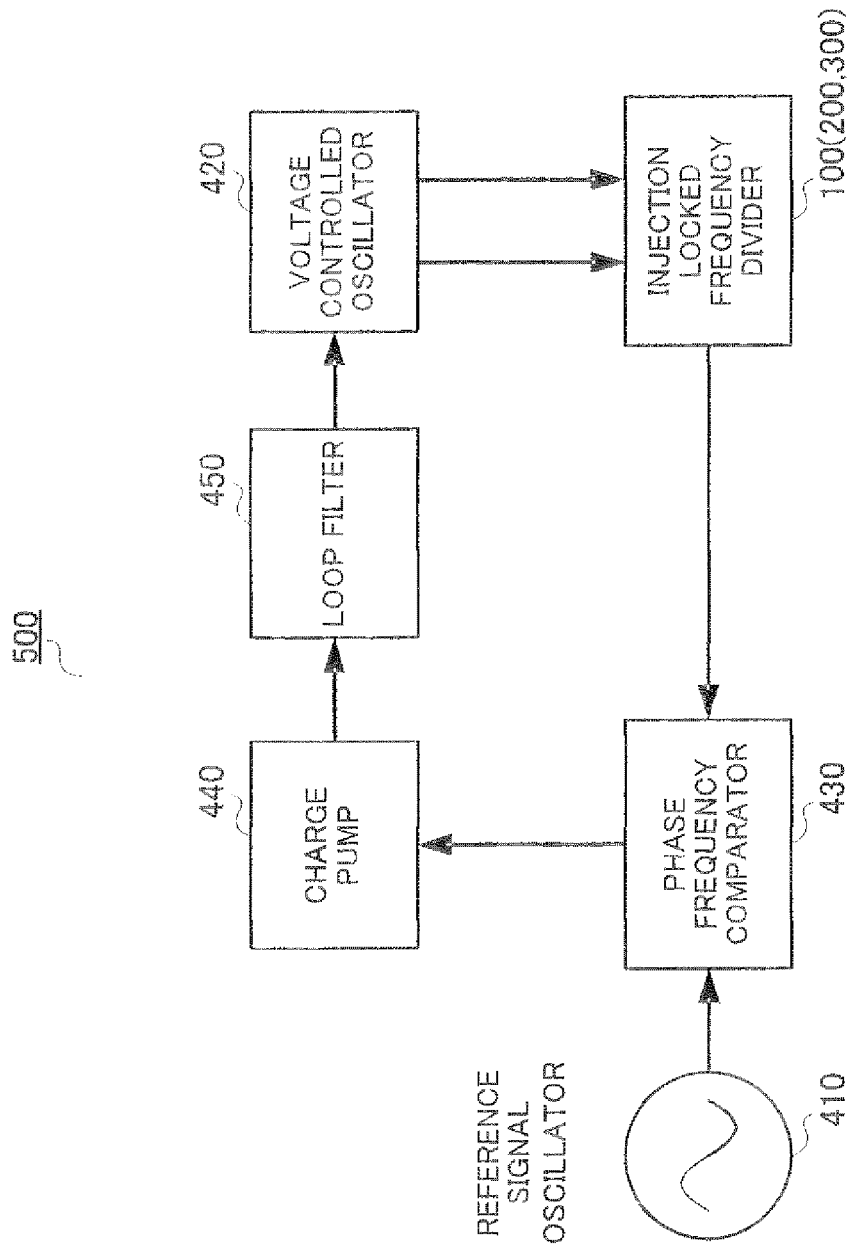
FIG. 16 is a diagram showing configuration of a PLL circuit according to Embodiment 5 of the present invention.

FIG. 16 is a diagram showing the configuration of a PLL circuit according to Embodiment 5 of the present invention.

As shown in FIG. 16, PLL circuit 500 includes injection locked frequency divider 100 of FIG. 6 (or either injection locked frequency divider 200 of FIG. 12 or injection locked frequency divider 300 of FIG. 14), reference signal oscillator 410, voltage controlled oscillator 420, phase frequency detector 430, charge pump 440, and loop filter 450.

Next, the operation of PLL circuit 500 will be described.

Voltage controlled oscillator 420 outputs a high frequency signal. The high frequency signal is frequency-divided to a low frequency by injection locked frequency divider 100 (200, 300).

Phase frequency detector 430 compares the frequency division signal of injection locked frequency divider 100 (200, 300) with the output signal of reference signal oscillator 410, and outputs a phase-frequency error to charge pump 440.

Charge pump 440 converts the phase-frequency error detected by phase frequency detector 430 to an electric current, and loop filter 450 generates the control voltage of voltage controlled oscillator 420.

Since the control voltage controls voltage controlled oscillator 420 so that the error detected by phase frequency detector 430 can become smaller, PLL circuit 500 is operated as a PLL circuit that performs a frequency negative feedback operation.

In this way, in PLL circuit 500 of this embodiment, injection locked frequency divider 100 (200, 300) of Embodiments 1, 2, or 3 are used as the injection locked frequency divider of the PLL circuit. Since the operating frequency bandwidth of injection locked frequency divider 100 (200, 300) is wide, the PLL circuit that has a wide operating frequency bandwidth can be realized.

In addition, since injection locked frequency divider 100 (200, 300) performs odd-number frequency division and has a larger frequency division number than a ½ frequency divider, the number of frequency dividers in the PLL circuit can be reduced and the PLL circuit that is small and can reduce power consumption can be realized.

In addition, there is an excellent effect in which injection locked frequency divider 100 (200, 300) can be used in various PLL circuits for general purpose.

Further, when a fixed frequency divider or a frequency divider including a programmable counter is connected between injection locked frequency divider 100 (200, 300) and phase frequency detector 430 to perform frequency division to a low frequency, there is the same effect.

The above description is merely illustrative of preferred embodiments of the present invention and the scope of the invention is not limited to this. For instance, although in the above embodiments, the MOS transistor is used, any MOS transistor may be used. For instance, an MIS (Metal Insulated Semiconductor) transistor may be used.

In addition, the MIS transistor may be an MIS transistor formed on a silicon substrate of an SOI (Silicon On Insulator) structure. Further, a bipolar transistor, a Bi-CMOS, or a combination of these may be used. However, needless to say, the MOS transistor is advantageous in point of power consumption.

In addition, although the name "injection locked frequency divider" is used in the embodiments for ease of explanation, "frequency divider," "PLL device" and so forth are possible naturally.

Further, the respective circuit sections configuring the injection locked frequency divider, for instance, the number of stages of inverter gates in the ring oscillator and the type of a logic element, are not limited to the above embodiments. Of course, needless to say, various transistors for compensation may be added to this injection locked frequency divider.

The disclosure of Japanese Patent Application No. 2010-012131, filed on Jan. 22, 2010, including the specification, drawings, and abstract, is incorporated herein by reference in its entirety.

INDUSTRIAL APPLICABILITY

The injection locked frequency divider and the PLL circuit according to the present invention can be used as an injection locked frequency divider and a PLL circuit for use in a portable communication terminal device, and are particularly useful as an injection locked frequency divider and a PLL circuit, having a wide frequency bandwidth and capable of frequency-dividing a frequency signal of at least 10 GHz. In addition, the injection locked frequency divider and the PLL circuit are applicable as an injection locked frequency divider to all electronic circuits.

REFERENCE SIGNS LIST 100, 200, 300 Injection locked frequency divider
111, 121, 131, 150, 212, 222, 232, 251, 252, 253, 350 N-channel MOS transistor
112, 122, 132, 212, 222, 232 P-channel MOS transistor 140, 240 Ring oscillator
141 First amplifier circuit
142 Second amplifier circuit
143 Third amplifier circuit
160 Differential signal injection circuit
250 Electric current source
400 Fixed frequency divider circuit
410 Reference signal oscillator
420 Voltage controlled oscillator
430 Phase frequency detector
440 Charge pump
450 Loop filter
500 PLL circuit

The invention claimed is:

1. An injection locked frequency divider comprising:
a ring oscillator that cascade-connects amplifier circuits each including an N-channel metal oxide semiconductor transistor and a P-channel metal oxide semiconductor transistor in (2n+1) (n is any natural number) stages in a ring;
an electric current source that is connected to the ring oscillator and includes an N-channel metal oxide semiconductor transistor that drives the ring oscillator; and
a differential signal injection circuit that outputs an injection signal to the ring oscillator and outputs a reverse phase signal of the injection signal as a differential signal to the electric current source, wherein:
the drain of the N-channel metal oxide semiconductor transistor of the electric current source is connected to the source of the N-channel metal oxide semiconductor transistor of the ring oscillator; and
the differential signal injection circuit outputs the injection signal to the gate of the P-channel metal oxide semiconductor transistor of the ring oscillator and outputs the differential signal to the gate of the N-channel metal oxide semiconductor transistor of the electric current source.

2. The injection locked frequency divider according to claim 1, wherein an output stage of the ring oscillator superimposes a signal amplified based on the injection signal on a signal amplified based on the differential signal in phase for output.

3. The injection locked frequency divider according to claim 1, wherein the differential signal injection circuit injects a signal having a frequency m (2n+1) (m is any natural number) times oscillation signal of the ring oscillator.

4. A phase locked loop circuit that performs a frequency negative feedback operation, comprising:
a reference signal oscillator that outputs a reference signal;
a voltage controlled oscillator that outputs a high frequency signal;
an injection locked frequency divider that frequency-divides the high frequency signal;
a phase frequency detector that compares an frequency division signal of the injection locked frequency divider with an output signal of the reference signal oscillator and outputs a phase-frequency error;
a charge pump that converts the phase-frequency error detected by the phase frequency detector to an electric current; and
a loop filter that generates a control voltage of the voltage controlled oscillator and outputs a generated control voltage to the voltage controlled oscillator, wherein the control voltage controls the voltage controlled oscillator so that the error detected by the phase frequency detector can become smaller, the phase locked loop circuit,
wherein the injection locked frequency divider is the injection locked frequency divider according to claim 1.

* * * * *